(12) United States Patent
Pillion et al.

(10) Patent No.: US 6,428,852 B1
(45) Date of Patent: Aug. 6, 2002

(54) PROCESS FOR COATING A SOLID SURFACE WITH A LIQUID COMPOSITION

(75) Inventors: John E. Pillion, Brookline, NH (US); Michael E. Clarke, Chelmsford; Jill Boski, Northampton, both of MA (US)

(73) Assignee: Mykrolis Corporation, Billerica, MA (US)

( * ) Notice: Subject to any disclaimer, the term of this patent is extended or adjusted under 35 U.S.C. 154(b) by 0 days.

(21) Appl. No.: 09/743,008

(22) PCT Filed: Jul. 1, 1999

(86) PCT No.: PCT/US99/15024

§ 371 (c)(1),
(2), (4) Date: Dec. 29, 2000

(87) PCT Pub. No.: WO00/01495

PCT Pub. Date: Jan. 13, 2000

Related U.S. Application Data

(60) Provisional application No. 60/091,489, filed on Jul. 2, 1998.

(51) Int. Cl.[7] .............................. B05D 3/12; B05D 3/04; B05C 11/02

(52) U.S. Cl. .................. 427/346; 427/240; 427/377; 427/294; 118/50; 118/52; 118/600; 438/782

(58) Field of Search ................................. 427/240, 376, 427/377, 385.5, 294; 118/52, 600, 320, 50; 438/782

(56) References Cited

U.S. PATENT DOCUMENTS 5,211,753 A * 5/1993 Swain ......................... 118/52
5,753,301 A * 5/1998 Brytsche et al. ............ 427/162
5,766,359 A    6/1998 Sichmann et al.

* cited by examiner

Primary Examiner—Michael Barr
(74) Attorney, Agent, or Firm—Mykrolis Corporation; Timothy J. King

(57) ABSTRACT

A process for coating a solid surface (42) with a conditioned liquid composition of substantially uniform thickness is provided. A liquid composition is conditioned by a) degassing either via vacuum or by sparging with a high kinematic viscosity gas; and b) substantially maintaining the viscosity of the liquid composition. The conditioned liquid may then be dispensed onto a solid surface (42) positioned in a sub-atmospheric environment (37) or in a helium-rich environment (37). The solid surface (42) is rotated so that the liquid composition forms a uniformly thick coating free from bubbles on the solid surface (42) and thereby produces a thin film of uniform thickness.

21 Claims, 5 Drawing Sheets

PROCESS FOR COATING A SOLID SURFACE WITH A LIQUID COMPOSITION

This application claims priority from provisional application Ser. No. 60/091,489, filed Jul. 2, 1998.

BACKGROUND OF THE INVENTION

This invention relates in part to a method and system for forming and coating a liquid composition on to a solid surface. More particularly, this invention relates to a process and system for coating a solid surface with a liquid polymer composition. The invention also relates to a method for conditioning liquid polymer compositions to optimize the uniformity of the thin films created during the coating process.

Liquid polymer compositions such as photoresists, anti-reflective coatings, and spin-on dielectrics are commonly used to coat a solid surface. For example, printed circuits presently are formed on the surface of a wafer such as silicon or gallium arsenide under cleanroom conditions. A commonly used process in microelectronic circuit manufacturing includes a step of applying a liquid photoresist onto the wafer surface and spinning the wafer so that the photoresist forms a thin, uniform coating on the wafer surface. The photoresist then is exposed to light through a patterned mask to transfer a circuit pattern from the mask onto the wafer. The exposed resist is developed to form an image of the desired circuit features on the wafer. Areas not coated with the developed photoresist are then processed further to form a semiconductor device.

Wafers having a diameter of 300 mm or larger are now in development. These diameters are larger than the diameters of commercially produced wafers. In order to attain a photoresist coating of the same thickness and uniformity as for the smaller diameter wafers, the 300 mm or larger wafers must be rotated at speeds that produce turbulent gas flow above the wafer. This turbulence may lead to non-uniform coating thickness, particularly adjacent to the edge of the wafer where the rotational speeds are the highest. A photoresist coating having non-uniform thickness is undesirable since it causes undesired variability in photoresist exposure and development.

To limit the turbulence above the wafer and thereby limit non-uniform photoresist coatings, it has been previously proposed to coat the wafer under partial vacuum. Unfortunately, it has been found that when the photoresist is dispensed into such a reduced pressure environment, the dissolved atmospheric gases in the photoresist liquid out gas by bubble formation. Bubble formation is undesirable because bubbles in the photoresist dispense lines and nozzle cause an inaccurate volume of photoresist to be dispensed on the wafer, thereby affecting final film uniformity on the wafer and the repeatability of the film coating from one wafer to the next. Those of ordinary skill in the art recognize that current typical dispense volumes are in the range of about 1 ml to about 10 ml of photoresist. Typically, each ml of resist is approximately 1 gram. Preferably, an approximately 3 ml dispense (3 grams) is used.

Bubbles are undesirable in the photoresist because they interfere with the exposure and development of the photoresist after it is dispensed onto the wafer. This distortion may result in breaks within the lines formed to define the features in the printed circuit. As the desired circuit elements and conductive lines of a printed circuit become smaller, the goal of the wafer manufacturers, even small bubbles may interfere with accurate transfer of lithographic patterns onto the wafer; generating defects in the lines used to define the printed circuit.

In the spin-coat process, an aliquot of the liquid composition, like a photoresist, is dispensed onto a stationary or slowly rotating substrate. The liquid composition contains solids at least partially dissolved in a volatile solvent. Such liquid compositions are typically true solutions; however, they can also include colloidal dispersions or suspensions. After the photoresist is dispensed onto the substrate, the substrate is rotated at speeds ranging from 1,000 to 7,000 rpm. During this high-speed spin up step, centrifugal forces spread the liquid composition across the substrate. Concurrent with this spin up step, the volatile solvent from the liquid composition evaporates. The result is a thin film of solid material deposited on the substrate. Uniform evaporation of solvent from the liquid composition aids in the formation of a uniform thin film.

In an optimized spin-coat process, the thickness of the deposited film is directly proportional to the viscosity and solvent fraction in the liquid composition deposited on the substrate. In addition, the final film thickness is proportional to the inverse square root of the final spin speed of the substrate. Lastly, optimum film uniformity from the spin-coat process occurs when the substrate is rotated at the highest possible spin speed at a constant temperature. The viscosity of the liquid composition changes with fluctuations in the temperature of the liquid. Accordingly, photoresist temperature is controlled to within $\pm 1°$ C. to minimize temperature-related changes in viscosity and hence film thickness.

In a semiconductor spin-coat process, a silicon wafer is typically the substrate and a typical liquid composition is a photoresist. In this application a highly uniform coating of the photoresist film across the wafer is required to achieve accurate transfer of lithographic patterns of the desired circuit features to the wafer. A uniformity of from about 5 to about 100 angstroms is currently needed for deposited photoresist films. The typical thickness of the deposited film ranges from about 0.5 to about 2 $\mu$m. While typical substrates currently being produced are about 200 mm in diameter, 300 mm and 450 mm diameter substrates are considered to be the choice for future manufacturing of semiconductors to decrease manufacturing costs and to increase die yields.

Besides accurate control of the viscosity and solvent fraction of the liquid composition, it is also currently necessary to have laminar flow conditions above the rotating substrate in order to achieve optimum final film uniformity.

When interaction between the rotating substrate and the gases above the substrate occurs, turbulent flow conditions can be produced in the gas above the substrate. A dimensionless number called the Reynolds Number, Re, can be used to characterize the flow conditions above the substrate. When the Reynolds Number is below $3 \times 10^5$ the flow is laminar, and when it is higher turbulent conditions exist. The Reynolds Number can be calculated using the equation below:

$$Re = \frac{((\text{substrate diameter (mm)})/(2*1000))^2}{(\text{kinematic viscosity (m}^2/\text{sec}))}$$

Using this equation, the Reynolds Number for a 300-mm substrate rotating at 4,000 rpm in a helium environment (kinematic viscosity 0.000123 m²/sec) would be $7.7 \times 10^4$.

The presence of turbulent conditions in the gas environment overlying the substrate results in a non-uniform evaporation rate of solvent from the liquid composition during the spin up cycle. As stated above, non-uniform evaporation decreases the final film uniformity across the wafer. As can be determined from the equation, lower Reynolds Numbers can be currently achieved by using high kinematic viscosity gases, lower spin speeds, or smaller substrates.

Gases like helium, hydrogen, and neon have a high kinematic viscosity when compared to air or nitrogen gas. The kinematic viscosity is defined as gas viscosity divided by the gas density. The kinematic viscosity of gases increases with increasing temperature or independently increases with decreasing gas pressure. Thus, reduced pressures and higher temperatures can be used to further reduce the turbulence above a spinning substrate. In a spin-coat process, the combination of reduced pressure, higher gas temperature, and high kinematic viscosity gas will give the lowest Reynolds Number for the environment above the substrate.

In the spin-coat process, a majority of the liquid composition dispensed onto the substrate is not used to coat the substrate. It is sloughed off the substrate and onto the chamber wall because of the centrifugal forces acting on the liquid as the substrate is rotated. As liquid compositions such as photoresist and spin-on dielectrics are very expensive, it follows that the cost of the manufacturing process can be reduced by minimizing the amount of liquid dispensed onto the substrate that is wasted. An accurate and repeatable volume of liquid solution must be dispensed onto the substrate in order to 1) completely coat the substrate; 2) to minimize the waste of these materials; 3) to insure that the thickness of the layer is consistent on the wafer and from wafer to wafer; and 4) to insure that the thickness of the film on the wafer is the desired thickness.

For spin coating in a reduced pressure environment, it is important to control the evaporation rate of solvent from the liquid composition. It is also necessary to control all the forces acting on the liquid so that accurate dispenses of the liquid can be made onto the substrate. In these respects it is very important to accurately control the pressure of the dispense environment.

In a reduced pressure environment, bubbles of gas will form in a liquid composition in both the liquid dispense lines, dispense nozzle(s), and in an aliquot of the liquid dispensed onto the substrate. The formation of bubbles in the liquid is due to outgassing of dissolved gases present in the liquid composition. The presence of bubbles in dispense lines and nozzle due to outgassing will cause inaccurate dispense and spitting of the liquid composition to occur and will effect final film thickness and uniformity.

Prior art means of removing gases and bubbles from liquids, like sparging and vacuum degassing, are effective, but result in uncontrolled loss of solvent from the liquid. Loss of solvent changes the fraction of solvent in the liquid composition and changes the viscosity of the liquid. As the prior art did not recognize the benefit of controlling the loss of solvent, spin-coat processes used in controlled atmosphere environments have undesired differences in film thickness and uniformity. Such liquids cannot be deposited on the substrate during the spin-coat process with the promise of an accurate and precise thin film.

U.S. Pat. No. 5,618,348 discloses a system for eliminating air from liquid-carrying conduits, such as tubing, included in a system for transfer of a liquid photoresist composition to a pump. There is no disclosure of the conditions under which the photoresist is degassed or coated on a wafer.

U.S. Pat. No. 5,013,586 discloses a process and apparatus for applying liquid photoresist to a spinning surface. A gas is introduced into a chamber above the spinning surface in a manner to effect laminar flow of the gas relative to the spinning surface.

U.S. Pat. Nos. 4,955,992 and 5,509,954 disclose systems for degassing a liquid, which utilize a vacuum.

U.S. Pat. No. 5,358,740 discloses a method and apparatus for low pressure spin coating under air to reduce turbulence above the wafer. However, no consideration or means are provided for delivery of degassed liquid to the chamber, and no means for controlling liquid viscosity are provided or considered. In a reduced pressure environment, liquids will out-gas, thereby forming bubbles within the liquid.

U.S. Pat. No. 4,587,139 discloses a process for coating a rotating disk with a liquid magnetic material containing a volatile solvent. An air barrier is positioned above the disc and coating. A gas having a high kinematic viscosity such as helium is injected into the space between the rotating disk and air barrier while the disk is rotated at high speeds. The use of helium alone for turbulence reduction is expensive compared to a reduced pressure method of turbulence reduction.

A process for making battery electrodes, U.S. Pat. No. 5,547,508, discloses dispensing degassed liquid solution onto a substrate in a vacuum environment. The process is used to prepare thin films of the solution using doctor blades or roll coaters to distribute the liquid over the substrate. In this process the liquid solution is degassed so as to create dense films of the liquid after it is suitably cured. The films are for use as electrodes in a battery device. Doctor blades or roll coaters are the means used to spread the liquid onto a horizontally moving substrate in this invention. Electrodes for batteries do not require the same degree of uniformity in the film thickness, as do films used in semiconductor manufacturing. The use of vacuum in this invention is not necessary to reduce turbulence above the substrate. The process and means of this invention are inadequate for making the highly uniform, particle free, thin films of liquid compositions used in modem semiconductor manufacturing. No action was taken to accurately control the viscosity of the liquid being dispensed onto the substrate in this invention.

What is needed is a process and apparatus for conditioning a liquid composition for use on the spin coating of substrates.

The process of the present invention provides such a conditioned liquid. Said process provides a bubble free, constant viscosity liquid that can assist in the production in more accurate and precise thin films.

SUMMARY OF THE INVENTION

The present invention provides a conditioned liquid composition used for spin coating in semiconductor manufacturing. Such composition aids in the reduction of turbulence above a rotating substrate while it also provides the solid material for deposition. The process and apparatus for producing such a conditioned liquid composition removes dissolved gases and bubbles. Such conditioned liquid compositions are characterized as having a viscosity that is substantially the same as it was prior to degassing as well as having a viscosity that does not fluctuate. The result is that predictable, accurate and repeatable volumes of the conditioned liquid composition can be dispensed onto a substrate in a reduced pressure environment for spin-coating.

The present invention provides a process and apparatus for coating a spinning solid surface such as a semiconductor wafer with a liquid composition such as a liquid photoresist or liquid antireflective coating. Typically, these liquid compositions have a viscosity between about 1 and about 150 centipoise (cP), more usually between about 1 and about 100 cP. For example, when utilizing a liquid photoresist composition, the liquid photoresist composition is degassed while maintaining a constant viscosity in a first step either by being subjected to a vacuum for a set time period or by being sparged with a high kinematic gas such as helium. This conditioned liquid composition is then dispensed, via a pumping means, onto a solid flat surface positioned in a chamber that is either air under vacuum or helium gas under vacuum. The solid surface having the photoresist deposited thereon is rotated to spread the photoresist over the entire solid surface. The present invention allows for the liquid composition to spread so the thickness of film is substantially uniform.

In a first aspect of this invention, a process and apparatus is provided for which uses reduced pressure for a pre-determined time and under pre-determined conditions to remove dissolved gases and bubbles to produce a conditioned liquid composition that is degassed and substantially maintains a constant viscosity and solvent fraction. The conditioned liquid composition does not out-gas to form bubbles in dispense lines and nozzle when dispensed into a spin-coating chamber that has a reduced pressure environment. By substantially controlling the pressure of the spin-coat chamber, accurate volumes of conditioned liquid composition can be delivered to the substrate.

In a second aspect of this invention, a high kinematic gas rather than vacuum is used to strip dissolved gases from the liquid composition. The process and apparatus maintain the viscosity and solvent fraction of the liquid during the process. The liquid composition of the present invention does not out-gas to form bubbles in dispense lines and nozzle when dispensed into a reduced pressure environment. By substantially controlling the pressure of the spin-coat chamber, accurate volumes of this embodiment of the conditioned liquid composition can be delivered to the substrate. The high kinematic viscosity gas present in this embodiment of the conditioned liquid composition and any excess from the stripping process can be used to further reduce the turbulence above the wafer during the spin up cycle. This preferable embodiment allows for higher spin speeds to be used, thinner films, and greater uniformity of such thinner films using the process and apparatus of this invention compared to previous means in the art.

In a preferable aspect of the present invention, the high kinematic gas is saturated with the solvent of the liquid composition prior to being introduced into the liquid composition to be conditioned. The benefit of such saturation is to minimize the affect degassing has on the viscosity of the liquid composition.

With respect to uniformity, the present invention provides a film that is uniform over a single wafer and that results in uniformity from wafer to wafer. This means that the deviation limitations required by the industry, in the range of 5–100 angstroms, is not for deviations in the thickness of the photoresist film of a single wafer, rather for all wafers subject to the process.

By removing highly soluble gases from a liquid composition that is also maintained at a substantially constant viscosity and solvent fraction in a first step and injecting a precise volume of this liquid composition onto a solid surface to be spun either in a substantially constant reduced pressure environment containing air or a high kinematic viscosity gas, the formation of bubbles and changes in viscosity in the liquid is minimized and the thickness of the coating produced is substantially uniform.

Lastly, an aspect of this invention is a process for conditioning a liquid composition for use in applying thin films, the process comprising degassing the liquid composition of interest, said liquid composition characterized as having solvent and solid portions and wherein said solid portion is at least partially dissolved in said solvent; and substantially maintaining the viscosity of said liquid during the degassing, said viscosity substantially maintained if the absolute viscosity and the standard deviation of the viscosity of the conditioned liquid composition are within a predetermined range.

DESCRIPTION OF SPECIFIC EMBODIMENTS

Figure 1:
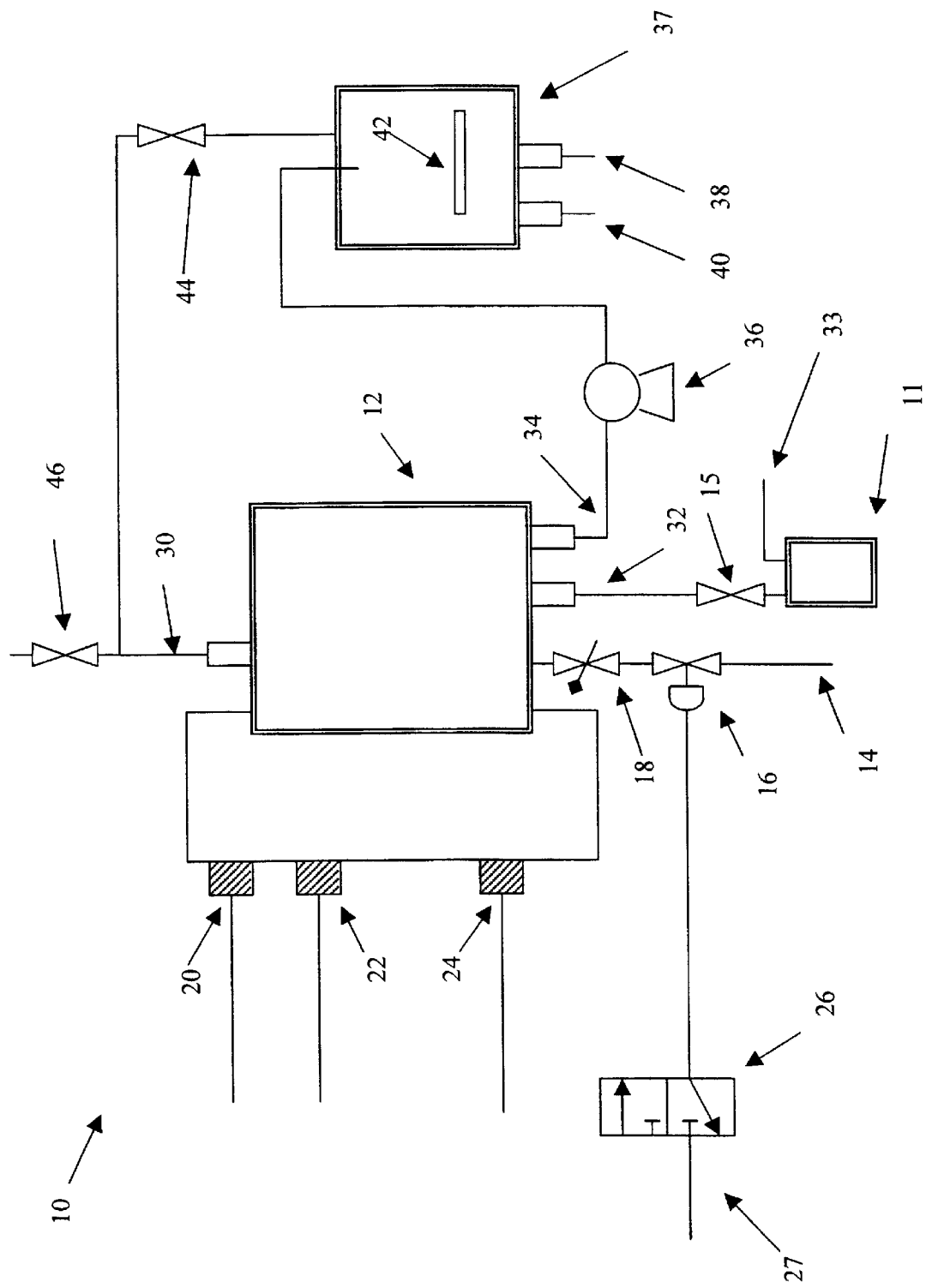
FIG. 1. is a schematic view illustrating the system of this invention.

The present invention provides a process and system capable of delivering substantially identical volumes of a degassed and constant viscosity liquid to a point of use over extended periods of time. The present invention also provides a process and system for conditioning liquid compositions used in thin-film applications. While the present invention will be described with reference to a liquid photoresist composition, it is to be understood that the present invention is useful for conditioning and delivering liquid samples in analogous arts.

In a first step of the process and system of this invention, the liquid, such as a liquid photoresist composition to be coated on a spinning solid surface, is degassed. One means of degassing is subjecting the liquid composition to a level of vacuum substantially the same as the pressure of the chamber into which the liquid is to be dispensed. The vacuum is applied until the formation of bubbles in the photoresist composition ceases.

Alternatively, a liquid can be degassed by sparging a high kinematic viscosity gas, like helium gas, by use of a fritted tube through the liquid photoresist composition, until the higher solubility gases have been replaced by the helium gas. For example, in a photoresist composition of 1 liter, substantially all the gas, primarily oxygen and nitrogen is removed from the liquid composition in between about 5 and 30 minutes at room temperature. Longer times are required for larger volumes of liquid and low sparging rates and shorter times are required for smaller volumes of liquid and higher sparging rates.

Yet another method of degassing the liquid composition comprises passing the liquid through the inside of a suitable porous hollow fiber membrane and then removing the dissolved gases from the liquid across the outside of the membrane. Liquid flow can also occur outside of the fiber with gas being removed across the membrane from the inside of the fiber. Degassing of the liquid using hollow fibers can be performed using vacuum or by gas stripping using preferably a high kinematic viscosity gas such as helium or neon.

In gas stripping, the helium gas can be pre-saturated with the solvent vapors from the liquid composition. The pre-saturated stripping gas can be used to degass the liquid composition either by sparging or by use of a hollow fiber device as described above. The helium or other high kinematic viscosity gas pre-saturated with solvent vapors reduces solvent loss from the liquid composition during the degassing and aids in the maintenance of the liquid composition's solvent fraction and viscosity.

Helium gas or helium gas saturated with solvent vapor that has been used to degas the liquid composition (stripping gas) can also be used to minimize turbulence in the spin-coat chamber. The benefits of injecting the stripping gas into the reduced pressure spin coater environment include lower costs. Use of high kinematic viscosity gas in a reduced pressure environment will allow higher spin speeds to be achieved. Also, the presence of solvent in the reduced pressure environment will reduce solvent loss from the liquid composition.

Once the liquid composition has been degassed, the liquid is them pumped onto a solid surface, such as a silicon or gallium arsenide wafer positioned within the chamber, having either a reduced pressure environment with air or a reduced pressure environment with a high kinematic viscosity gas like helium.

When utilizing a vacuum in the chamber where coating is to be effected, the sub-atmospheric pressure is between about 760 and about 400 torr (101,325 and about 53,316 Pa), preferably between about 650 and 500 torr (86,639 and about 66,645 Pa). The chamber pressure is controlled with a precision of about ±25 torr (±3,332 Pa) but preferably ±5 torr (±666 Pa) by means of a ballast valve or back pressure regulator. It has been found that these pressure ranges and conditions avoid excessive solvent evaporation, gives repeatable conditions for dispense and solvent evaporation, and reduces turbulent flow of gas at the surface of the liquid coating. As a result of this process, the liquid delivered to the substrate is substantially free of bubbles and is of constant viscosity.

When utilizing a helium atmosphere in the chamber where coating is effected, the pressure of helium is within the range from about 760 and about 400 torr (101,325 and about 53,316 Pa), preferably between about 650 and 500 torr (86,639 and about 66,645 Pa). The chamber pressure is controlled with a precision of about ±25 torr (±3,332 Pa) but preferably ±5 torr (±666 Pa) by means ballast valve or back pressure regulator. The use of a high kinematic viscosity gas like helium to remove highly soluble gases like oxygen and nitrogen from the liquid composition provides several advantages. First, in degassing it aids in the removal of bubbles and other dissolved gases from the liquid and thus eliminates bubbles from dispense lines, nozzle, and from the dispensed liquid. Secondly, when the liquid is deposited onto a solid surface in a reduced pressure environment, the atmosphere directly above the wafer will consist of helium and liquid solvent vapor(s). The effect of helium will be to increase the kinematic viscosity of the vapor above the wafer as helium out-gasses from the liquid. The higher kinematic viscosity gas above the wafer will reduce the turbulence above the wafer. Lastly, the helium gas used to degas the liquid composition by sparging or hollow fiber stripping can be injected above the substrate in the spin-coat chamber to provide an additional source of high kinematic viscosity gas allowing even further reduction of turbulence above the wafer.

Referring to FIG. 1, the system of this invention 10 is illustrated. A container 12 for a liquid composition to be degassed is provided with an inlet conduit 14. A valve 16 that is normally open and a needle valve 18 are used to control the rate at which liquids are in fluid communication with conduit 14. The container 12 is provided with sensors, such as photomicrosensors 20, 22, and 24. Sensor 24 senses the lack of fluid in container 12. Sensor 22 senses the top level of the liquid in the container 12 and functions to effect opening or closing of pneumatic two-way valve 26 supplied with pressurized air from air supply 27 which, in turn, effects opening or closing of valve 16. Valve 18 regulates the rate of liquid passing through conduit 14 into container 12. Sensor 20 senses overflow of liquid in container 12 and affects activation of an alarm (not shown) when the liquid level in container 12 is unacceptably high.

Conduit 30 is connected to a vacuum source through valve 46. When valves 44, 16 and valve 15 are closed the vacuum effects a sub-atmospheric pressure within container 12 which, in turn, effects removal of dissolved gases and bubbles from the liquid in container 12. Alternatively, removal of gas in the liquid within container 12 can be effected by sparging with helium gas from source conduit 33 which passes through container 11, valve 15, and is directed into container 12 through conduit 32 at a flow rate of between about 1 and 20,000 standard cubic centimeters per minute (sccm), preferably between about 5 and 1,800 sccm. Container 11 may be empty in which case helium gas from conduit 33 is substantially helium. Container 11 can also be filled with solvent which is substantially the same as that from the liquid composition so that gas entering container 11 is saturated with the solvent vapors prior to passing into container 12 through conduit 32. Pre-saturating the helium gas reduces solvent loss and viscosity changes due to helium gas sparging. Helium gas and stripped dissolved gases from the liquid in the container 12 are removed through conduit 30. When valve 44 is closed this excess gas is vented from conduit 30 through valve 46. When valve 46 is closed and valve 44 is opened, gas from conduit 30 is directed to the spin-coat chamber 37. The excess helium and solvent vapor from the degassing process in chamber 12 aids in turbulence reduction and reduced solvent evaporation in chamber 37.

After removal of dissolved gas from the liquid composition, the liquid is delivered by conduit 34 to pump 36 and onto a flat solid surface 42, such as a silicon wafer positioned with chamber 37. The chamber 37 has a precise, ±5 torr (±666 Pa), sub-atmospheric pressure by means of a conduit 38 connected to a vacuum source and back pressure regulator (not shown), to prevent turbulence above the spinning substrate 42 within chamber 37. Alternatively, helium gas can be introduced into chamber 37 through conduit 40 from a source (not shown). The precise pressure in the chamber 37 containing the helium can be controlled by means of the conduit 38 connected to a vacuum source and back pressure regulator, to prevent turbulence above the spinning substrate 42 within chamber 37.

Figure 3:
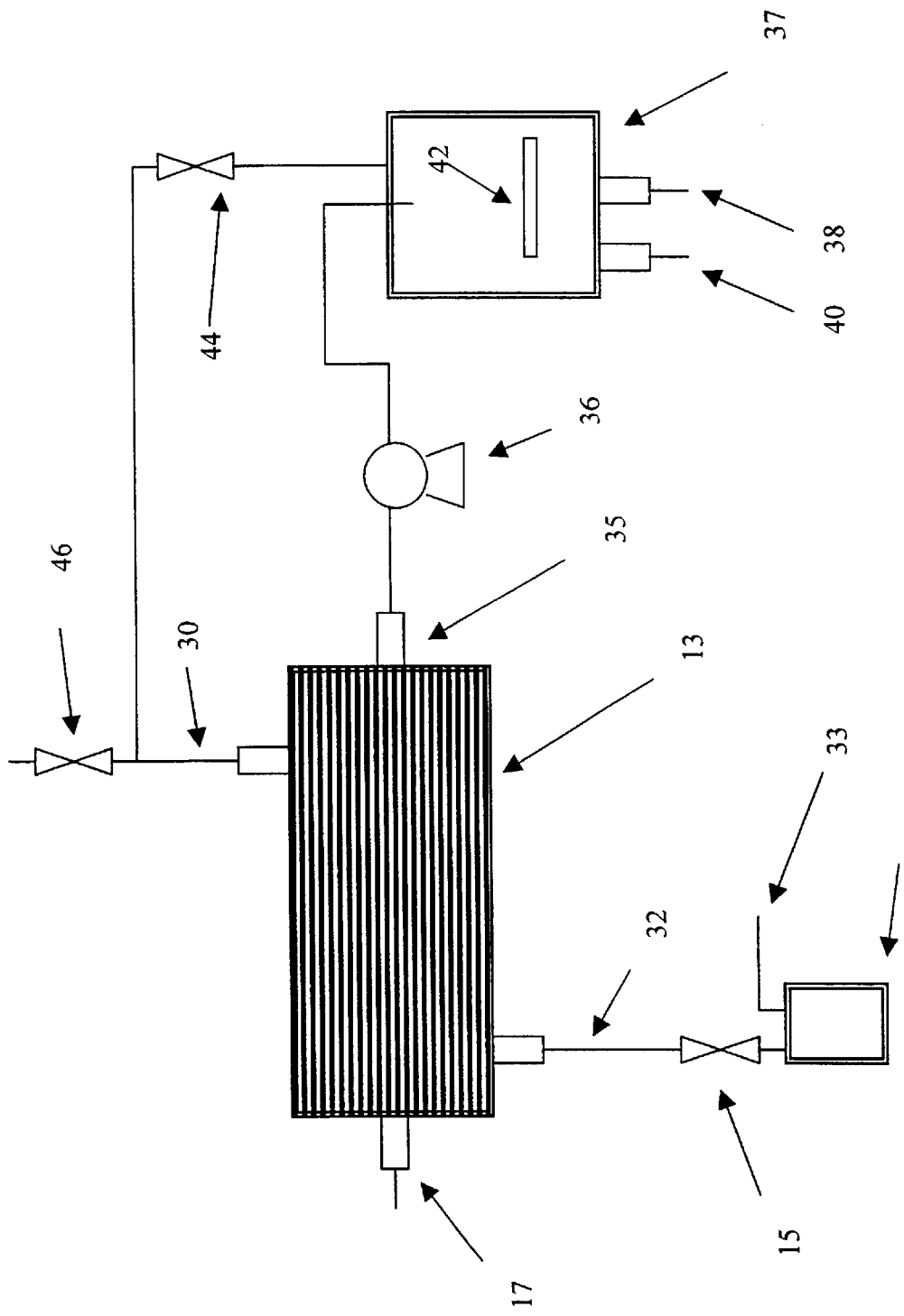
FIG. 3 is another embodiment of the system of this invention using a hollow fiber degasser

Another example of the system of this invention is illustrated in FIG. 3. A hollow fiber membrane device 13 with fibers suitable for degassing the liquid composition without wetting is provided for with inlet liquid conduit 17 and outlet liquid conduit 35. Liquid flow can be either inside or outside (cross flow) of the fibers, but for the purposes of this example liquid flow is within the fibers. The dispense pump 36 is used to control the flow of liquid which passes through the hollow fiber device 13.

Hollow fiber device 13 is connected to a conduit 30. With valves 15 and 44 closed, conduit 30 is connected to a vacuum source through valve 46. The vacuum effects a sub-atmospheric pressure on the outside of the hollow fiber membranes which in turn effects removal of dissolved gases and bubbles from the liquid contained within the hollow fibers. Degassed liquid at outlet 35 can be removed from hollow fiber device 13 by pump 36 for delivery to chamber 37.

In the system of FIG. 3, removal of gas from the liquid contained within the hollow fibers can also be effected by passing a helium strip gas outside of the hollow fibers which contain the liquid composition. Helium gas from conduit 33 passes through chamber 11 and exits chamber 11 through valve 15. The helium gas enters the hollow fiber device 13 through conduit 32 and exits 13 through conduit 30. Degassed liquid at outlet 35 can be pumped by pump 36 to coating chamber 37. When valve 44 is closed, the excess helium strip gas is vented from gas conduit 30 through valve 46. When valve 46 is closed and valve 44 is opened helium gas from conduit 30 is directed to the spin-coat chamber 37. The excess helium and solvent vapor from the degassing process in hollow fiber device 13 aids in turbulence reduction and reduced solvent evaporation in chamber 37.

The helium gas used to effect degassing in hollow fiber device 13 can be pre-saturated with solvent from the liquid composition to further aid in the reduction of solvent loss from the liquid composition due to degassing. Helium gas from conduit 33 enters chamber 11 containing solvent of substantially the same composition as that found in the liquid composition. Helium gas saturated with the solvent exits chamber 11 through valve 15 and enters the hollow fiber device 13 through conduit 32.

The following example illustrates the present invention and is not intended to limit the same.

EXAMPLE 1

Figure 2:
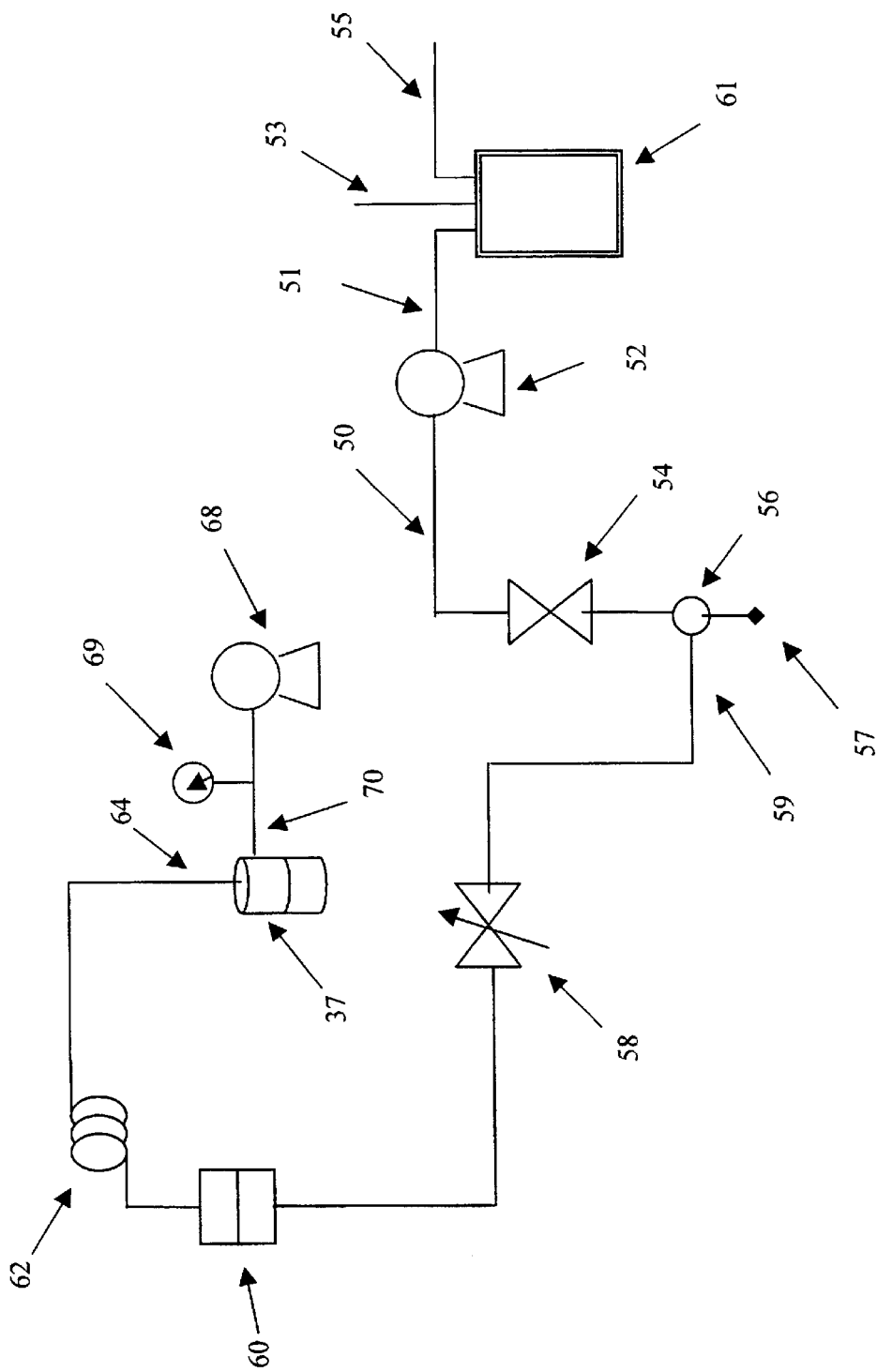
FIG. 2. is a schematic diagram of a test manifold utilized in Example 1.

A test manifold, FIG. 2, was designed to illustrate the process and system for the dispense of various lithographic fluids, of substantially constant viscosity, and without the formation of bubbles, into a reduced pressure environment. The manifold was designed to split the flow of the degassed fluid delivered from a pump into two equal portions. The photoresist used in this example was UV5 branded photoresist manufactured by Shipley LLC, Marlborough, Mass.

The pump, 52, with an LHVD Impact® filter, available from Millipore Corporation, Bedford, Mass., was connected to a source of 24 V power and an NEC Versa® computer for communications. Compressed air at 60 psig (413,502 Pa) and vacuum of 20 inches of mercury (67,727 Pa) were supplied to the pump. The track cable supplied with the pump was configured with acknowledgment lines 3, 7, and 8 for the operation of stop suck back valves. A 24-volt power supply was used to supply power for external solenoid valve circuit boards and valves.

Teflon® tubes, 0.25 inches (0.635 cm) OD×0.125 inches (0.318 cm) ID×27 inches (68.6 cm) length were used to connect the pump's inlet, vent, and purge fittings to a separate fluid reservoir. The fluid reservoir was a 1-liter PFA Teflon® cylinder from Savillex, Corporation, Minnetonka, Minn. with a cap containing six 0.25 inch (0.635 cm) fluid connectors and a single 0.375 inch (0.953 cm) fluid connector. Referring to FIG. 2, a liquid composition contained in vessel 61 is degassed by helium gas delivered into vessel 61 from tubing 55 and vented from vessel 61 through tubing 53. The degassed liquid composition is transferred from vessel 61 by pump 52 through tubing 51. The degassed fluid dispensed from the tubing 50 at the outlet of the pump 52 is passed through a valve 54 and into a tee fitting 56 where fluid flow was split into two portions 57 and 59. Each portion of fluid passed through a needle valve 58, a stop suck back valve 60, a 5 foot length of coiled Teflon® tubing 62, and then into the dispense nozzle 64. The external stop suck back valves 60 were used to control fluid dispense to each of the two dispense nozzles in the manifold. Each stop suck back valve required three adjustable speed valves and a 24 volt solenoid valve to control air actuation to the stop suck back valves.

Tubing 62 between the suck back valve and nozzle was coiled into a 4 inch (10.2 cm) diameter circle and held horizontally to simulate a heat exchanger. Fluid in each of the two manifold lines was dispensed into two reduced pressure chambers 37 connected to vacuum pump 68. O-rings were used to seal the top and bottom half of the vacuum chamber 37 to effect a vacuum seal. The bottom half of the vacuum chamber 37 could be removed and weighed to determine the mass of the dispensed fluid. Dispense nozzles 64 were made of Teflon® and were either 3 mm ID or 0.0625 inch ID.

Pressure for the chambers 37 during a dispense cycle was maintained at ±5 torr (±666 Pa). This was done by adjusting the back pressure regulation valve on the vacuum pump 68 until the reading on a pressure transducer 69 connected to the vacuum line was within ±5 torr (±666 Pa) of the previous dispense. Each dispense and vacuum cycle was completed in a fixed period of time (60 sec).

The pump and dispense system were primed with fluid at atmospheric pressure. Bubbles due to incomplete wetting of the Teflon® dispense tubing in the apparatus were removed with dispense cycles of 3 ml/sec for 2 seconds and a purge vent of 0.5 ml. A filtration rate of 2 ml/second was used to minimize cycle times. Valves and tee connectors were freed from bubbles by vertically orienting them and dispensing fluid through them until they were cleared.

The stop suck back nozzles were adjusted to provide approximately 1–2 mm of suck back at the end of a dispense with a smooth drawback of fluid.

The resistance of each dispense line was adjusted using the needle valves 58 once the suck back valves had been tuned. A series of dispenses were made into the dispense flasks at atmospheric or reduced pressure. The dispense mass was measured and the needle valves 58 opened or closed until the mass dispensed into each flask through nozzles 64 were within about 0.05 grams of each other.

Degassing of the fluid was accomplished using either vacuum or helium sparging of the fluid contained within the 1000 ml Savillex PFA Teflon® container. This was accomplished by treating the fluid to be dispensed with vacuum 600–530 torr (79,974 to 70,643 Pa) or helium sparge (30 sccm) for about 1 hour prior to use.

Five dispenses were used to "prime" the system after a recipe or pressure change was made to the test manifold. The average values and standard deviation calculated for the dispense run were made without these priming points.

Bubble free dispenses at atmospheric pressure were successfully made without external degassing for all fluids using the system of this example.

The presence of bubbles in fluids in the dispense lines was determined visually. When liquids to be dispensed into a reduced pressure environment were sparged with air or argon instead of helium, fine (approximately 100–400 um) bubbles formed in the liquid that was present in the dispense lines and nozzle. The bubbles could be removed from the dispense lines by degassing the fluid in reservoir 12 with helium or vacuum (FIG. 1) and purging the dispense lines with the degassed liquid.

Figure 4:
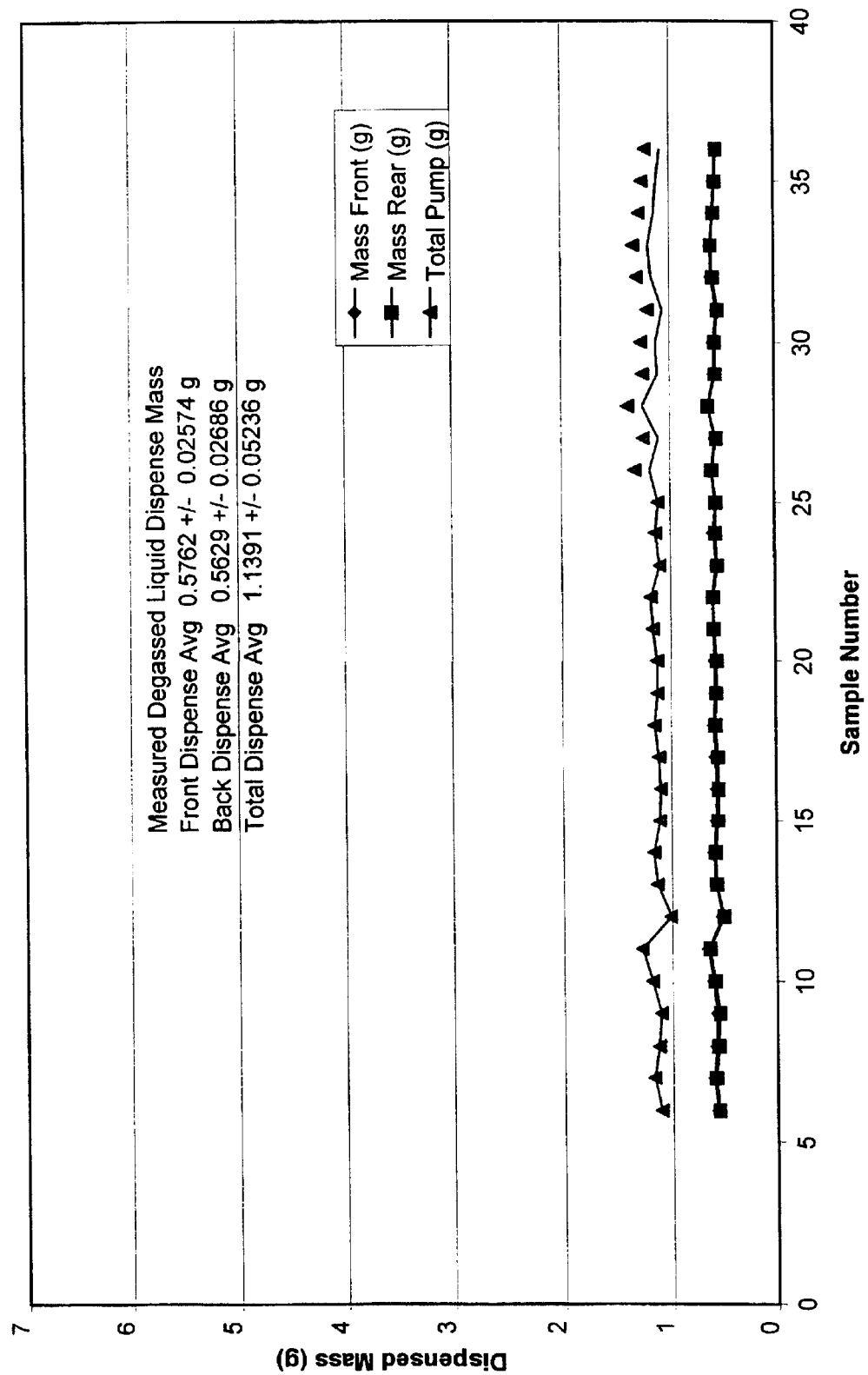
FIG. 4 is a graph illustrating the liquid dispense repeatability with the system of this invention in Example 1 at 530 torr (70,643 Pascal) pressure with pressure control ±5 torr (±666 Pa).

Under various conditions, pressure from 475 to 760 torr (63,312 to 101,325 Pa), fluid viscosity 2–55 cP, fluid dispense rates from 0.08 to 3 ml/sec/nozzle, dispense volumes 0.5 to 3 ml/nozzle, and filtration rates up to 2 ml/second, no bubbles were formed in the liquids during dispense into a reduced pressure environment using the process and system in this example. FIG. 4 is a graph which illustrates the precision that bubble free helium degassed photoresist was dispensed from the two nozzles described in the apparatus of this example into two 530±5 torr (70,642±666 Pa) reduced pressure environments 37. The standard deviation in mass for photoresist dispensed from each nozzle are given in FIG. 4. The repeatability in dispense mass for each nozzle was less than 0.027 grams for 30 dispenses.

Figure 5:
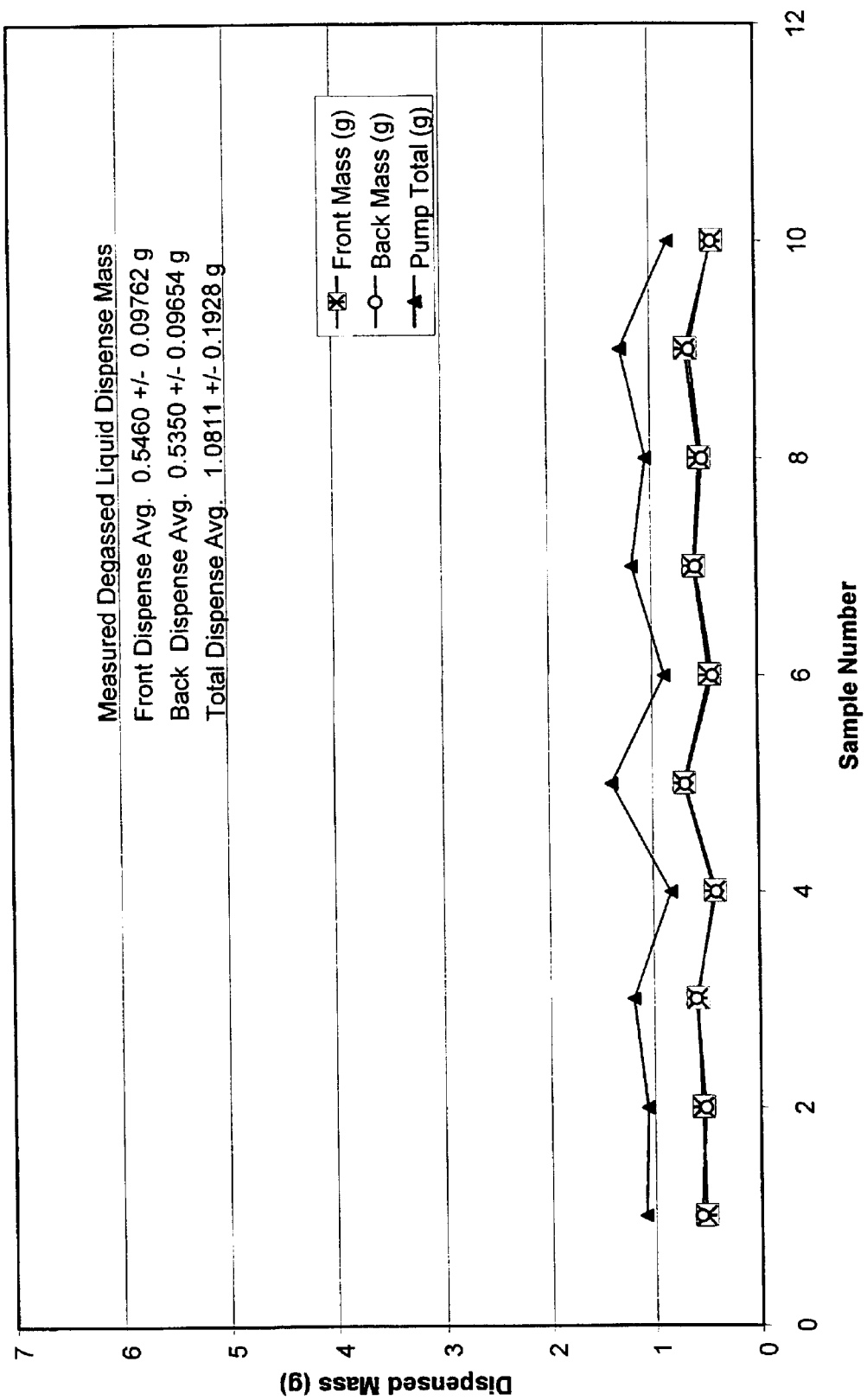
FIG. 5. is a graph illustrating the liquid dispense repeatability with the system of this invention in Example 1 at 530 torr (70,643 Pascal) with pressure control ±25 torr (±3332 Pa).

Fluid mass dispensed through the manifold at reduce pressure is sensitive to the pressure of the dispense system. System pressure was controlled to about ±5 torr (±666 Pa) for optimum dispense repeatability as shown in FIG. 4. Control of pressure level is necessary for the repeatable evaporation of solvent in a reduced pressure spin coating process. FIG. 5 shows dispense volume repeatability, 0.096 g, pressure control is ±25 torr (±3,332 Pa). The results shown in FIG. 5 the same photoresist and dispense conditions shown in FIG. 4.

Using the process and system illustrated in this example, Table 1 sets forth that while practicing the subject invention, a dispensed fluid substantially maintained its viscosity and did so with significant precision. Upon practicing the invention, the difference in viscosity was generally less than about 3 cP and the range of standard deviation was from ±0.02 to ±0.56 cP, with an average of about ±0.085 cP. Please for experiments 11 and 12 the inlet and outlet viscometers of experiments 1–10 were switched. Thus, one can conclude that the limitations of the viscometers must be considered in determining the actual viscosity of the unconditioned and the conditioned stream.

TABLE 1

| Run | Helium Gas Flow (cc/min) | Degassing Time (min) | Resist Viscosity Before Degassing (cP) | Resist Viscosity After Degassing (cP) |
|---|---|---|---|---|
| 1 | 10 | 10 | 11.41 ± 0.04 | 13.59 ± 0.02 |
| 2 | 10 | 30 | 12.96 ± 0.12 | 12.65 ± 0.39 |
| 3 | 25 | 10 | 11.41 ± 0.06 | 13.49 ± 0.04 |
| 4 | 25 | 30 | 11.55 ± 0.07 | 13.41 ± 0.18 |
| 5 | 10 | 10 | 11.64 ± 0.56 | 12.34 ± 0.07 |
| 6 | 10 | 30 | 11.60 ± 0.04 | 13.72 ± 0.05 |
| 7 | 25 | 10 | 12.53 ± 0.02 | 13.62 ± 0.04 |
| 8 | 25 | 30 | 11.80 ± 0.05 | 13.53 ± 0.03 |
| 9 | 17.5 | 20 | 12.97 ± 0.02 | 13.69 ± 0.07 |
| 10 | 17.5 | 20 | 12.71 ± 0.06 | 13.56 ± 0.06 |
| 11 | 17.5 | 20 | 13.03 ± 0.17 | 11.59 ± 0.05 |
| 12 | 17.5 | 20 | 11.07 ± 0.03 | 11.99 ± 0.02 |

An illustration of the process and apparatus of the invention to maintain the viscosity of a liquid composition after various helium degassing treatments of the liquid composition are summarized in Table 2. The photoresist used in this example was also UV5 branded photoresist manufactured by Shipley LLC, Marlborough, Mass.

Viscosity measurements were made on a liquid composition that had been treated on a portion of the apparatus shown in FIG. 2. For each treatment in this example, a 40 ml sample of the fluid composition contained in vessel 61 was degassed by helium gas delivered into vessel 61 from tubing 55 and vented from vessel 61 through tubing 53. The helium gas flow rate into vessel 61 was controlled by a rotometer connected to tubing 55 that was itself connected to a helium gas cylinder (not shown). Pre-saturation of the helium gas with solvent from the liquid composition was accomplished by sparging the helium gas through a vessel containing the solvent (not shown) and delivering the solvent saturated helium gas to the liquid composition sample in vessel 61 through tubing 55. The viscosity of the treated fluid samples were measured using a Zahn Cup viscometer. A sample of the liquid composition was allowed to stand in air and was used as a control.

TABLE 2

Viscosity of a photoresist liquid composition following various degassing treatments.

| Treatment | Treatment Time(min) | Viscosity (cP) |
|---|---|---|
| Neat Photoresist-control in air | 57 | 86.6 |
| Sparge with Helium at 269 cc/min | 30 | 90.9 |
| Sparge with Helium at 269 cc/min | 66 | 102.5 |
| Sparge with Helium at 1612 cc/min | 32 | 109.2 |
| Sparge with Helium at 1612 cc/min | 66 | 117.2 |
| Sparge with Solvent Saturated Helium at 1612 cc/min | 30 | 85.2 |
| Sparge with Solvent Saturated Helium at 1612 cc/min | 60 | 83.9 |

The results in Table 2 show that degassing the liquid composition with reduced helium gas flow rate for a minimal treatment time substantially maintains the measured viscosity for the liquid composition. Degassing the liquid composition with helium that has been pre-saturated with the solvent from the liquid composition substantially maintains the viscosity of the liquid composition.

What is claimed is:

1. A process for uniformly distributing a liquid composition that includes a solvent on a substrate, the process comprising:

a) degassing the liquid composition;

b) substantially maintaining the viscosity of the liquid composition while it is degassed;

c) dispensing a pre-determined volume of the liquid of step b) on said substrate, said substrate in a substantially constant pressure atmosphere between about 350 to 760 torr; and d) rotating said substrate to distribute the degassed liquid composition uniformly over said substrate.

2. The process of claim 1, wherein said degassing step is accomplished by subjecting the liquid composition to vacuum.

3. The process of claim 1, wherein said degassing step is accomplished by introducing a high kinematic viscosity gas in an amount sufficient to substantially displace other gases in said liquid composition.

4. The process of claim 3, wherein substantial maintenance of viscosity of the liquid is accomplished by saturating said high kinematic viscosity gas with said solvent prior to degassing said liquid composition.

5. The process of claim 1, wherein the pressure in said substantially constant pressure atmosphere fluctuates only about ±25 torr or less.

6. The process of claim 5, wherein the pressure fluctuates only about ±5 torr or less.

7. The process of claim 3, wherein the high kinematic viscosity gas is helium.

8. The process of claim 3, wherein the high kinematic viscosity gas is neon.

9. The process of claim 3 further comprising the step of reducing the turbulence created by the rotation of the substrate.

10. The process of claim 9, wherein the gas from step a) is introduced into the substantially constant pressure atmosphere.

11. The process of claim 1, wherein the atmosphere of step c) is air.

12. The process of claim 1, wherein the atmosphere of step c) is a high kinematic viscosity gas.

13. The process of claims 2 or 3, wherein said liquid composition is degassed while passing through at least one hollow fiber.

14. An apparatus for uniformly distributing a conditioned liquid composition on a substrate, said apparatus comprising:
   a vessel;
   means for degassing said liquid decomposition while in said vessel;
   means for substantially maintaining the viscosity of said liquid composition prior to dispensing;
   means for dispensing said degassed liquid on said substrate;
   means for rotating said substrate to speeds sufficient for spreading said degassed liquid uniformly thereon; and
   means for reducing turbulence due to rotation of said substrate.

15. The apparatus of claim 14, wherein said means for reducing turbulence includes a substantially constant pressure atmosphere below 760 torr in which the substrate is rotated.

16. The apparatus of claim 14, wherein said means for degassing said liquid composition while in said vessel is a high kinematic viscosity gas sparge.

17. The apparatus of claim 14, wherein said means for degassing said liquid composition while said in said vessel is a vacuum environment.

18. The apparatus of claim 14, wherein said means for substantially maintaining the viscosity of said liquid composition prior to dispensing is a low flow rate of sparge high kinematic viscosity gas.

19. The apparatus of claim 14, wherein said means for substantially maintaining the viscosity of said liquid composition prior to dispensing is a low flow rate of sparge high kinematic viscosity gas, said gas saturated with solvent.

20. The apparatus of claim 14, wherein said means for substantially maintaining the viscosity of said liquid composition prior to dispensing is the application of vacuum to said liquid composition over a predetermined period of time.

21. A process for conditioning a liquid composition for use in spin-coating, the process comprising:
   degassing the liquid composition of interest, said liquid composition characterized as having solvent and solid portions and wherein said solid portion is at least partially dissolved in said solvent; and
   substantially maintaining the viscosity of said liquid during the degassing, said viscosity substantially maintained if the absolute viscosity and the standard deviation of the viscosity of the conditioned liquid composition are within a pre-determined range.

* * * * *